United States Patent
Wang

(10) Patent No.: US 9,355,840 B2
(45) Date of Patent: May 31, 2016

(54) HIGH QUALITY DEVICES GROWTH ON PIXELATED PATTERNED TEMPLATES

(75) Inventor: Wang Nang Wang, Bath (GB)

(73) Assignee: NANOGAN LIMITED, Bath, Somerset (GB)

(*) Notice: Subject to any disclaimer, the term of this patent is extended or adjusted under 35 U.S.C. 154(b) by 0 days.

(21) Appl. No.: 13/884,258

(22) PCT Filed: Nov. 7, 2011

(86) PCT No.: PCT/GB2011/052149
§ 371 (c)(1),
(2), (4) Date: Feb. 19, 2014

(87) PCT Pub. No.: WO2012/063045
PCT Pub. Date: May 18, 2012

(65) Prior Publication Data
US 2014/0183700 A1    Jul. 3, 2014

(30) Foreign Application Priority Data

Nov. 8, 2010 (GB) .................................. 1018788.8

(51) Int. Cl.
*H01L 21/36* (2006.01)
*H01L 21/20* (2006.01)
(Continued)

(52) U.S. Cl.
CPC ........ *H01L 21/0243* (2013.01); *H01L 21/0237* (2013.01); *H01L 21/0242* (2013.01); *H01L 21/0254* (2013.01); *H01L 21/02381* (2013.01); *H01L 21/02458* (2013.01); *H01L 21/02488* (2013.01); *H01L 21/02494* (2013.01); *H01L 21/02587* (2013.01); *H01L 29/04* (2013.01); *H01L 33/007* (2013.01); *H01L 33/22* (2013.01); *H01L 2924/0002* (2013.01); *Y10T 428/24802* (2015.01)

(58) Field of Classification Search
CPC ................ H01L 21/78; H01L 21/0262; H01L 21/02532; H01L 21/0254; H01L 21/02381; H01L 21/823807; H01L 29/0657; H01L 29/045; H01L 2924/14; H01L 23/585
USPC .......... 257/618, 620, 623, 627; 438/478, 479, 438/493, 497, 503, 507
See application file for complete search history.

(56) References Cited

U.S. PATENT DOCUMENTS

| | | | |
|---|---|---|---|
| 7,488,671 B2* | 2/2009 | Corderman et al. | .......... 438/479 |
| 7,982,296 B2* | 7/2011 | Nuzzo | .................... B82Y 10/00 |
| | | | 257/466 |
| 2003/0160232 A1 | 8/2003 | Kozaki et al. | |

(Continued)

FOREIGN PATENT DOCUMENTS

| | | |
|---|---|---|
| EP | 1 054 442 A1 | 11/2000 |
| EP | 1 398 829 A2 | 3/2004 |
| WO | WO 2010/059131 A1 | 5/2010 |

OTHER PUBLICATIONS

International Search Report dated Jan. 31, 2012 for International Application No. PCT/GB2011/052149, 3 pgs.

*Primary Examiner* — Hsien Ming Lee
(74) *Attorney, Agent, or Firm* — Lewis Roca Rothgerber Christie LLP

(57) ABSTRACT

A method of producing a template material for growing semiconductor materials and/or devices, comprises the steps of: (a) providing a substrate with a dielectric layer on the substrate; and (b) forming a pixelated pattern on the dielectric layer, the pattern comprising a plurality of discrete groups of structures.

16 Claims, 2 Drawing Sheets

Figure 1A:
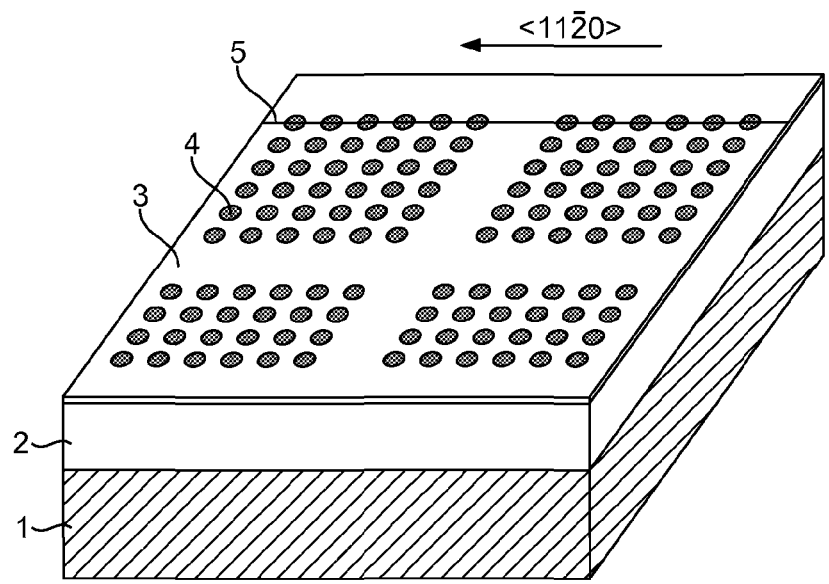

(51) Int. Cl.
*H01L 29/06* (2006.01)
*H01L 21/02* (2006.01)
*H01L 29/04* (2006.01)
*H01L 33/00* (2010.01)
*H01L 33/22* (2010.01)

(56) References Cited

U.S. PATENT DOCUMENTS

2010/0025727 A1    2/2010   Haskell
2012/0070627 A1*   3/2012   Chuang et al. ............. 428/195.1

* cited by examiner

HIGH QUALITY DEVICES GROWTH ON PIXELATED PATTERNED TEMPLATES

This application is a National Phase Patent Application of International Application Number PCT/GB2011/052149, filed on Nov. 7, 2011, which claims priority to and the benefit of British application No. 1018788.8, filed on Nov. 8, 2010.

The present invention relates to a method of producing a template material for growing semiconductor materials and/or devices, a method of producing semiconductor materials and/or devices, and a template material comprising a substrate with a dielectric layer on the substrate.

Wide band-gap GaN and related materials are recognized to be among the most attractive compound semiconductors for use in a variety of devices. They are adapted for optoelectronic and microelectronic devices which operate in a wide spectral range, from visible to ultraviolet and in the high temperature/high power applications area. The main advantages of III-V nitride semiconductors in comparison with other wide-band-gap semiconductors is their low propensity to degrade at high temperature and high power when used for optical and microelectronic devices.

Despite the technological advances of the last few years, one of the key obstacles preventing further developments in GaN devices is the lack of high quality and commercially available low-cost GaN templates. Alternative substrates, such as sapphire, Si, and SiC are commonly employed in nitride-based devices. As a result of lattice mismatch and large differences in the thermal expansion coefficients between the deposited film and substrate (heteroepitaxy), a very high ($\sim 10^9$ to $10^{19}$ cm$^{-2}$) density of threading dislocations and serious wafer bending/cracking, induced by undesired residual strain, typically occurs in the grown nitride layers. These factors can significantly affect the performance and lifetime of nitride-based optoelectronic and microelectronic devices. The strain-induced wafer bowing also hinders the progress of III-V nitrides devices grown on larger substrates such as 4 inch (~101.6 mm), 6 inch (152.4 mm), and even larger diameter ones.

Only a few methods have been introduced to overcome such problems. Most growth relies on using much thicker substrates. For example: 4 inch (101.6 mm) sapphire used for GaN light-emitting diode (LED) growth has thickness ranging from about 650 to 900 μm, while 6 inch sapphire has thickness ranging from about 750 μm to 1.25 mm. Regularly-patterned substrates are also used to enhance the light extraction for III-V nitride based LEDs.

1. "Enhancement of the light output power of InGaN/GaN light-emitting diodes grown on pyramidal patterned sapphire substrates in the micro- and nanoscale", Journal of Applied Physics, 103, 014314_2008, Haiyong Gao, Fawang Yan, Yang Zhang, Jinmin Li, Yiping Zeng, and Guohong Wang.
2. "Improved Light Extraction Efficiency of InGaN-Based Light-Emitting Diodes with Patterned n-GaN Substrate", Japanese Journal of Applied Physics, 46 (12), 7622, (2007), Kwang-Woo Kwon, Si-Hyun Park_, Seong-Su Choi, Bong-Jin Kim, Ig-Hyeon Kim, June Key Lee, Sang Wan Ryu, and Young Ho Kim.
3. "InGaN-Based Near-Ultraviolet and Blue-Light-Emitting Diodes with High External Quantum Efficiency Using a Patterned Sapphire Substrate and a Mesh Electrode", Japanese Journal of Applied Physics, Part 2, 41 (12B), L1431, (2002). Motokazu Yamada, Tomotsugu Mitani, Yukio Narukawa, Shuji Shioji, Isamu Niki, Shinya Sonobe, Kouichiro Deguchi, Masahiko Sano and Takashi Mukai.

It is an object of the present invention to provide a method of growing high-quality materials and devices on large diameter substrates (approximately 4 inches (~101.6 mm) upward) using composite pixelated patterned templates, which function to not only decouple the lattice mismatch and the difference of thermal expansion coefficient between the substrate and the top devices, but also to minimise the strain of the grown devices.

Here, the term "pattern" is used to denote a layout of structures provided on a template, where the layout is non-uniform across the extent of the template. In particular, patterning denotes that the structures are arranged in predefined, spatially-separated groups on the surface of the template, with spatial boundaries between the groups.

Such patterns may consist of more than one type of shape and size in one template and can be made of integrated micro-patterns, nano-patterns, and micro-nano-patterns defined by individual pixels. In the case of composite pixelated micro-patterns, the patterns consist of combined micrometer sized patterns of different shape and size with the pixel boundary defined by different micro-patterns. In the case of composite pixelated nano-patterns, the patterns consist of combined nanometer-scale sized patterns of different shape and size with the pixel boundary defined by different patterns. In the case of composite micro-nano-patterns, the patterns consist of combined micrometer-scale and nanometer-scale sized patterns of different shapes and sizes with the pixel boundary defined by different micrometer-scale sized patterns.

In accordance with the present invention there is provided a method of producing a template material for growing semiconductor materials and/or devices, comprising the steps of:
  (a) providing a substrate with a dielectric layer on the substrate; and
  (b) forming a pixelated pattern on the dielectric layer, the pattern comprising a plurality of discrete groups of structures.

In accordance with a second aspect of the invention there is provided a method of producing semiconductor materials and/or devices, comprising the steps of providing a template material produced in accordance with the first aspect, and
  (c) growing semiconductor materials and/or devices onto the template.

In accordance with a third aspect of the present invention there is provided a template material comprising a substrate with a dielectric layer on the substrate; the dielectric layer including a plurality of structures formed thereon, wherein the plurality of structures are arranged in discrete groups, forming a pixelated pattern on the dielectric layer.

The template can consist of a simple substrate or a substrate with materials deposited on the top.

Preferably, the substrate material is selected from the group consisting of sapphire, silicon, silicon carbide, diamond (single crystal and polycrystalline), metals, alloys, metal oxides, compound semiconductors, glass, quartz and composite materials. For the growth of normal polar materials such as c-plane GaN, the crystal orientation of the substrate can be c-plane Sapphire. For the growth of polar and semi-polar materials, the crystal orientation of the substrate may be γ- and m-plane sapphire, m-plane 4H- and 6H-SiC, or (113) Si.

Alternatively, the substrate material may be selected from the group consisting of conductive substrates, insulating substrates and semi-conducting substrates.

The substrate material may comprise a single crystal.

The substrate material may comprise a layer of deposited semiconductors.

The template may comprise one of: a simple layer, or of the heterostructure, or of superlattices consisting of n- and p-type doped and un-doped semiconductors consisting of III-V and II-VI compounds.

The template can be coated with semiconductors, conductors, insulators, or a combination of these. In the example of III-V nitrides, the template can be made of a simple layer, or of the heterostructure, or of superlattices consisting of n- and p-type doped and un-doped semiconductors such as AlN, $Al_xGa_{1-x}N$ with $1>x>0$, GaN, $In_xGa_{1-x}N$ with $1>x>0$. The total thickness of the grown semiconductor layers is preferably less than 3 p.m. Examples of such templates can be substrate/AlN (~20 nm)/GaN (1-3 µm), substrate/AlN (~20 nm)/AlGaN (1-3 µm)/GaN (10-100 nm), substrate/AlN (~20 nm)/AlGaN (1-3 µm)/InGaN (10-100 nm)/GaN (10-100 nm), substrate/GaN/(AlGaN 2.5-10 nm/GaN 2.5-10 nm superlattices), substrate/GaN/(AlGaN 2.5-10 nm/AlN 2.5-10 nm superlattices)/GaN (10-100 nm), substrate/GaN/(InGaN 2.5-10 nm/GaN 2.5-10 nm superlattices)/GaN (10-100 nm), substrate/$Si_3N_4$/AlN (~20 nm)/GaN (1-3 µm)/p-GaN (10-100 nm). In the example of insulators, the deposited materials on the substrate can for example comprise metal oxides, nitrides, or a mixture of oxynitrides consisting of two or more of silicon oxide, silicon nitride, aluminium oxide, aluminium nitrides, silicon oxynitrides, aluminium oxynitrides, tungsten silicon nitrides, silicon carbon nitrides. In the example of conductors, the deposited materials on the substrate can for example comprise metals, alloys, titanium nitride, zinc oxide, different types of transparent conducting oxides (TCOs), composites with a metal/alloy base and ceramic-based embedded materials.

The composite patterns can be made of pixelated micro-patterns, nano-patterns, and micro-nano-patterns, where the "micro/nano" prefix relates to the size of structure used within the pattern. In the case of composite pixelated micro-patterns, the patterns may comprise combined micrometer-scale sized patterns of different shapes and sizes. In the case of composite pixelated nano-patterns, the patterns may comprise combined nanometer-scale sized patterns of different shapes and sizes. In the case of composite pixelated micro-nano-patterns, the patterns may comprise combined micrometer and nanometer-scale sized patterns of different shapes and sizes. In all the above described composite pixelated patterns, the patterns may comprise boundaries defined by the micrometer and nanometer-scale sized patterns.

In the case of composite pixelated micro-nano patterns, the composite micro-nano-patterns may comprise combined regular or irregular micrometer and nanometer-scale sized structures. The micrometer and nanometer sized structures may be in the shape of stripes, circles, triangles, or any other polygonal shapes, or alternatively, they may comprise holes, rods, pillars, or combined forms. The sidewalls of these structures may be vertical, at an inclined angle, hemispherical, or with a combined profile. The dimension of the micrometer-scale sized structures may range from about one micrometer to several hundred micrometers. The distance between the micrometer-scale sized structures may range from about one micrometer to several thousand micrometers. The nanometer-scale sized structures may be distributed between the micrometer-scale sized structures, with their dimensions ranging from about one nanometer to several hundred nanometers. The combined micro-nano-scale patterns may be comprise fully mixed micrometer-scale size patterns and nanometer-scale size patterns, which penetrate each other. Alternatively, the micrometer-scale sized patterns may form a boundary to confine the nanometer-scale sized patterns.

In the case of composite pixelated micro-nano-scale patterns, and the nano-pattern made of nanocolumns: the nanocolumns may be fabricated with different aspect ratios (height versus the cross section of the nanocolumns). The shape of the nanocolumns may be modified by further wet etching, and such treatment allows the diameter of the nanocolumns to be finely tuned for optimized lateral overgrowth and ready separation of such grown devices from the substrate.

A further ex-situ or in-situ nitridation may prevent the coalescence of the nanocolumns in the root, and hence maximize the decoupling mechanism of the nanocolumns to reduce the defects density and cracking of the top laterally-grown layers and devices.

In the case of composite pixelated micro-nano-scale patterns, and the nano-patterns comprising nanometer-scale holes the dimensions of the nanometer-scale holes may be fabricated with different aspect ratios (height versus the cross section of the nanometer-scale holes).

In the case of composite pixelated micro-nano-scale patterns, the pixelated patterns may comprise a clearly defined boundary by micrometer-scale sized stripes, within a boundary containing the regular or irregular nanometer-scale sized structures, and the combined regular or irregular micrometer and nanometer-scale sized structures. The micrometer and nanometer-scale sized structures may be in the shape of stripes, circles, triangles, or any other type polygonal shapes. Alternatively, they may be holes, rods, pillars, and combined forms. The sidewalls of these structures may be vertical, at an inclined angle, hemispherical, or with a combined profile. The dimensions of the micrometer-scale sized structures may range from about one micrometer to several hundred micrometers. The distance between the micrometer-scale sized structures may range from about one micrometer to several thousand micrometers. The nanometer-scale sized structures may be distributed between the micrometer-scale sized structures, with their dimensions ranging from about one nanometer to several hundred nanometers.

The composite patterning may be fabricated by direct imprinting using composite patterned masks containing both micro- and nano-scale sized patterns, then followed by dry, wet, or combined dry and wet etching to create composite micro-nano patterned structures. The composite patterning may also be fabricated by creating the nano-patterning first, then followed by micro-patterning. The nano-patterning may be produced by a novel metal annealing method, the anodic porous alumina, interferometry method, submicron-lithography, direct E-beam writing or any other nano-imprint technologies. The micro-patterning may be produced by photolithography, then followed by dry, wet, or combined dry and wet etching. Alternatively the micro-patterning may be produced by any direct writing methods such as laser cutting, mechanical cutting, or focused ion beam etching.

The growth of compound semiconductor materials and/or devices onto the composite patterned templates may be carried out by an HVPE, MOCVD (MOVPE), CVD, sputtering, sublimation, or MBE method, or a combination of HVPE, MOCVD (MOVPE), CVD, sputtering, sublimation and MBE.

The grown compound semiconductor devices may be separated from the substrate after the p-side of the device has been bonded to a sub-mount wafer. The separation may be done by mechanically cracking the weak nano-columns, by wet etching, photochemical etching, electrochemical etching, or by laser ablation.

An exemplary method in accordance with the invention utilizes MOCVD, HVPE, or MBE methods to grow high quality flat, low strain and low defect density compound semiconductors onto foreign substrates using composite pixelated patterned templates. Examples of micro-nano-scale structures used include micro-nano holes, micro-nano columns (also known as "micro-nano-rods" or "micro-nano-wires") of substantially constant diameter along the majority of their length, or other structures, for example pyramids, cones or spheroids which have varying diameter along their major dimensions. For simplicity, the following description will discuss the use of composite pixelated patterns consisting of micrometer-scale sized stripes with defined boundaries and nanometer-scale sized structures confined within the boundaries. However, it should be realised that other suitable composite patterned structures such as those mentioned above may be also be used, and indeed may be advantageous for certain applications. The composite pixelated patterns can be fabricated directly onto a substrate or onto a template comprising a substrate, with initial compound semiconductor layers grown by MBE, CVD, MOCVD (MOVPE) or HVPE methods. Such pixelated patterns may typically have boundary stripes of width about 1 to 100 µm, and nanostructures of about 10 to 999 nm. Further growth of epitaxial compound semiconductor layers for a full device can be achieved by MBE, MOCVD or HVPE. One example of the pixelated pattern can have the pixel size of a rectangular shape of 250 µm by 500 µm, or a square shape of 1000 µm by 100 µm.

Using such methodology, compound semiconductor layer bending due to the thermal expansion coefficient difference between the compound semiconductor materials and the substrate can be confined to the pixels. There will be no growth of compound semiconductor materials or the growth of high defective compound semiconductor materials in the boundary stripes, which are etched with high roughness or coated with growth prevention materials. The reduced size of the growth area minimizes the strain significantly for growth on large diameter substrates. The nanostructures within the boundary stripes facilitate nano-pendeo lateral overgrowth, subsequently minimizing the defects for compound semiconductor materials and devices grown on top of the nanostructures. The controlled dimension of the nanostructures and the localized stress between the nanostructures and lateral grown layer also allows the compound semiconductor layer, for example GaN, to be readily separated from the substrate, for example during rapid cooling or mechanical twisting. The boundary stripes and the small pixel size allow a rapid etching to remove the top-grown materials and devices. The initial substrates can be of different crystal orientation, for example: c-plane sapphire (on axis, or with different off-axis cutting), γ-plane sapphire, (111) Si, (113) Si, m-plane 4H and 6-H SiC. High quality low strain and low defect density non-polar, semi-polar, and polar compound semiconductor layers can be epitaxially overgrown using etched nanocolumns fabricated on the initial non-polar, semi-polar, or polar compound semiconductor layers grown on top of the substrates of different crystal orientation. Hence this invention can provide a very economical mass production technology for high performance devices grown on top of the low strain and low defects density compound semiconductor materials.

The growth processes provided by the invention can be applied to the family of III-V nitride compounds, generally of the formula $In_xGa_yAl_{1-x-y}N$, where $0 \leq x \leq 1$, $0 \leq y \leq 1$, and $0 \leq x+y \leq 1$, or other suitable semiconducting nitrides. Group II-VI compounds may also be suitable for production through the methodology of the present invention. The semiconductor may for example comprise materials such as GaN, AlN, InN, ZnO, SiC. Throughout the following description, the invention is described using GaN as an example of an epitaxial III-V nitride layer as the semiconductor material for convenience, though any suitable semiconducting material may be used.

The nano-masks used to etch the template can be produced by a novel metal annealing method, the anodic porous alumina, interferometry method, e-Beam lithography, or any other nano-imprint technologies.

The dielectric material such as $SiO_2$ or $Si_3N_4$ which can be deposited by sputtering, e-beam evaporation, or PECVD will serve as the mask with the replicated pattern from the masks produced by the imprinting (micro- and nano-meter size), photolithography, interferometry, e-beam lithography, ink-jet printing, or other feasible methods as will be apparent to those skilled in the art. The thickness of the dielectric layer depends on the etching selectivity between the dielectric materials and the "to be etched" semiconductor layers.

Dry etching of the semiconductor layers may be carried out by reactive ion etching (RIE) or inductively coupled plasma etching (ICP) using Ar, $CHF_3$, $SF_6$, $Cl_2$, $BCl_3$, $H_2$ gas mixtures. Further wet etching using different acids and bases enables fine tuning of the micro- and nano-structures. In situ or ex situ nitridation of the micro- and nano-structures can be performed to reduce the side wall coalescence of the micro- and nano-structures during the lateral overgrowth, consequently maintaining the integrity of the voids between the micro- and nano-structures for decoupling the thermal expansion difference between the substrate and the lateral overgrown layer.

The fabricated III-Nitrides composite pixelated templates can be loaded for the initial thin continuous GaN epitaxial lateral overgrowth (ELOG) using MBE, MOCVD or HVPE. Templates prepared in this way can then be loaded for the full device epitaxial growth using MOCVD, MBE or HVPE.

Figure 1B:
Figure 1C:
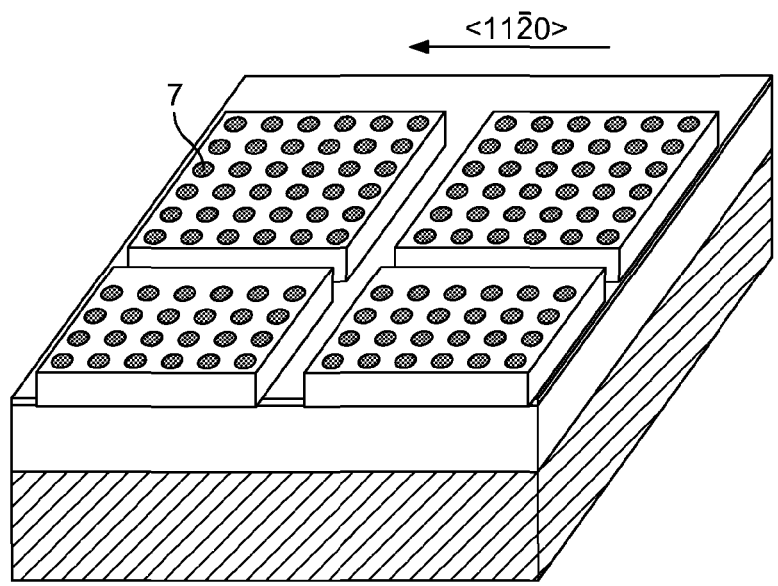
Figure 2A:
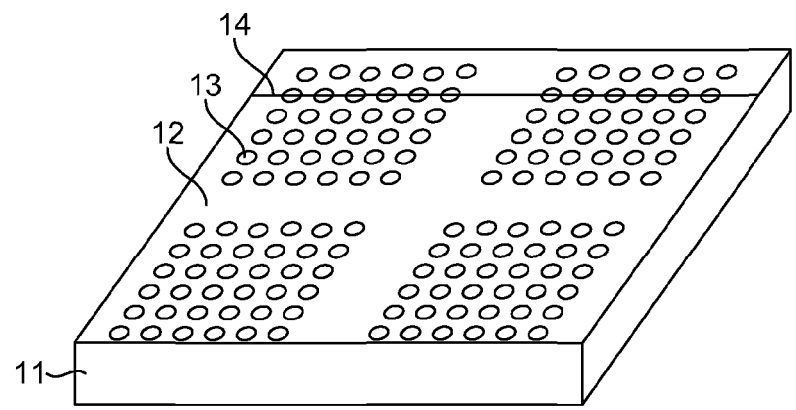
Figure 2B:
Figure 3A:
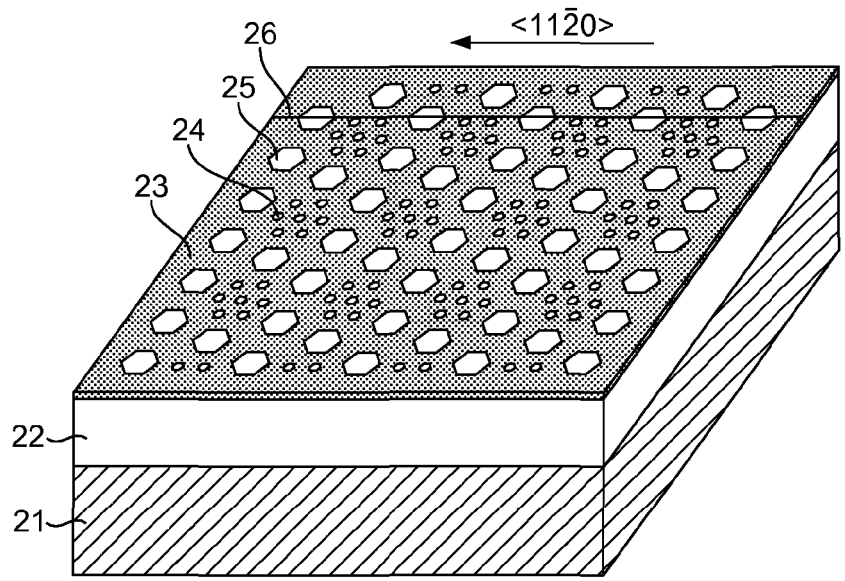
Figure 3B:

Specific embodiments of the invention will now be described with reference to the accompanying drawings, in which:

FIG. 1a schematically shows part of a pixelated patterned template in accordance with an embodiment of the present invention with nano-patterns, separated by micrometer-scale sized stripes;

FIG. 1b schematically shows a cross-sectional view of the template of FIG. 1a;

FIG. 1c schematically shows a full LED structure grown on the substrate of FIG. 1a;

FIG. 2a schematically shows a pixelated patterned template in accordance with a second embodiment of the present invention with nano-patterns separated by the micrometer-scale sized stripes;

FIG. 2b schematically shows a cross-sectional view of the template of FIG. 2a;

FIG. 3a schematically shows part of a composite pixelated patterned template in accordance with a third embodiment of the present invention, with nano-patterns separated by the micrometer-scale sized pattern; and FIG. 3b schematically shows a cross-sectional view of the template of FIG. 3a.

To illustrate the invention, various practical examples using techniques in accordance with the inventive method are described below.

EXAMPLE 1

A (111) silicon substrate of thickness between about 2 to 6 inches (~50.8 mm to ~152.4 mm) in diameter with MOCVD deposited un-doped U-AlN of 20-200 nm is used as the template for the fabrication of composite pixelated patterns. Before loading, the AlN/Si template is degreased in KOH for few seconds, then rinsed in deionized water. A thin dielectric layer of $SiO_2$ or $Si_3N_4$ of ~200 nm is deposited by PECVD onto the AlN/Si template. Then a printable photoresist is spin coated onto the AlN/Si template, followed by nano-imprint using a disposable master. Two step UV curing processes plus heating are performed to harden the imprinted patterns. Firstly, reactive ion etching (RIE) using Ar and $O_2$ is used to etch the imprinted resist and expose the dielectric. Then the dielectric is etched by the second RIE etching using Ar and $CHF_3$ to remove the dielectric and to expose the AlN.

FIG. 1 schematically shows part of a pixelated patterned template with nano-patterns, here shown as spatially separated groupings of nanometer-scale holes 4, separated by micrometer-sized stripes. The width of the stripes is around 15 μm, and the nano-pattern comprises discrete groups of circular nanometer-scale holes 4 with diameters around 100-250 nm, each group being arranged in a substantially square configuration. The gap between the pattern groups is around 150-250 nm. The substrate 1 comprises (111) Si, which is deposited with a layer 2 of ~20-100 nm AlN, and the pattern is formed in a layer 3 of ~200 nm thick dielectric Si3N4 deposited onto the AlN layer 2. The nanometer-scale sized pattern comprising a plurality of circular nanometer-scale holes 4 is etched through the dielectric layer 3, to expose the AlN. The profile of the etched nanometer-scale holes 4 along the line 5 is illustrated in FIG. 1b.

The pixelated patterned template is then loaded into a MOCVD reactor. The epitaxial growth of the full device is continued in the MOCVD reactor. Typical LED structures formed may for example comprise the following layers: n-type Si-doped GaN layer (~1.5-2 μm), InGaN/GaN MQW active region (~35 Å-100 Å, 2-6 pairs), AlGaN:Mg capping layer (~200 Å), p-type Mg-doped GaN (~0.2-0.3 μm). The electron and hole concentrations in the GaN:Si and GaN:Mg layers are about $3\times10^{18}$ $cm^{-3}$ and $6\times10^{17}$ $cm^{-3}$, respectively. The epitaxy growth of the full LED structure is confined by the wide micrometer-scale (~15 μm) Si3N4 stripes. Therefore, very little or no growth is observed on the stripes. The full LED structure is grown as a number of individual devices separated by the stripes, i.e. a separate device is grown onto each group of nanometer-scale holes. The lateral growth over the nanometer-sized gap provides a defects annihilation mechanism to reduce strain and defects density. FIG. 1c shows an individual LED epitaxy structure 7 grown on the pixelated patterned template. The devices are separated by the micrometer-scale sized wide stripes. The full LED structure may be deposited with p-contact metals and alloys, reflectors, and heat sink metal composite, then mounted onto a sub-mount. The mounted LED devices can then be separated from the substrate by laser ablation, wet etching or electrochemical etching. The final device is a thin GaN vertical LED.

EXAMPLE 2

The composite pixelated pattern generation processes and the epitaxial growth processes are essentially the same as for the first example, except the substrate is a c-plane sapphire of between about 2 to 6 inches (~50.8 to 152.4 mm), in diameter with MOCVD deposited un-doped GaN or Si doped GaN of ~20-1000 nm for the fabrication of composite pixelated patterns.

As for Example 1, a full LED structure may be grown on the composite pixelated patterned templates, and deposited with p-contact metals and alloys, reflectors, and heat sink metal composite, then mounted onto a sub-mount. The mounted LED devices can then be separated from the substrate by laser ablation, wet etching or electrochemical etching. The final device is a thin GaN vertical LED.

EXAMPLE 3

A C-plane sapphire of between about 2 to 6 inches (~50.8 to 152.4 mm) in diameter is used as the template for the fabrication of composite pixelated patterns. Before loading, the template is degreased in KOH for few seconds, then rinsed in deionized water. A thin dielectric layer of $SiO_2$ or $Si_3N_4$ of ~200 nm is deposited by PECVD onto the sapphire template. Then a printable photoresist is spin coated onto the template, followed by nano-imprint using a disposable master. Two steps of UV curing processes plus heating hardens the imprinted patterns. Firstly, reactive ion etching (RIE) using Ar and $O_2$ is used to etch the imprinted resist and expose the dielectric. Then the dielectric is etched by a second RIE etching using Ar and $CHF_3$ to remove the dielectric and to expose the sapphire. Then the template is etched by ICP using Ar and BCl3 and a dielectric mask to remove part of the sapphire. A further wet etching using H2SO4 and H3PO4 acts to smooth the surface of the pattern. Thus the fabricated template is a pixelated sapphire substrate with etched patterns.

FIG. 2a shows a schematic drawing of the pixelated patterned sapphire template with the nano-patterns separated by the micrometer-scale sized stripes. Here the width of the stripe is around 15 μm, and the nano-pattern comprises a plurality of hemispherical profile nano-dots with circular diameters of 100-600 nm arranged in substantially square groups. The height of the nano-dots is around 100-350 nm. The gap between the circular patterns is around 100-550 nm. The stripe pattern is a deep etched sapphire of 100 to 500 nm depth. The substrate is c-plane sapphire 11. The hemispherical profile nano-dots 13 are etched using a dielectric mask. The profile of the etched nano-dots 13 and the deep etched stripes 12 along the line 14 is illustrated in FIG. 2b.

A full LED structure may be grown on the composite pixelated patterned templates, and deposited with p-contact metals and alloys, reflectors, and heat sink metal composite, then mounted onto a sub-mount. The mounted LED devices can then be separated from the substrate by laser ablation, wet etching or electrochemical etching. The final device is a thin GaN vertical LED.

EXAMPLE 4

In this example, a C-plane sapphire of between about 2 to 6 inches (~50.8 to 152.4 mm) in diameter with MOCVD deposited GaN (un-doped or Si doped) is used as the template for the fabrication of composite pixelated patterns. Another difference from Example 1 is the design of the composite pixelated pattern. In this example a composite pattern is used which comprises a nanometer-scale sized pattern separated by a micrometer-scale sized pattern of substantially the same shape but with different size. FIG. 3a shows a schematic drawing of the pixelated patterned sapphire template with MOCVD deposited GaN and hexagonal nano-hole patterns 24 surrounded by the hexagonal micrometer-scale sized patterns 25. It can be seen that there are a plurality of groups of hexagonal nanometer-scale holes, each group also being substantially hexagonal, each group being surrounded by six hexagonal micrometer-scale hexagonal holes. The dimension of each micrometer-scale sized hexagonal hole is around 5-20 μm, and the hexagonal nano-hole diameter is around 100-350 nm. The gap between the hexagonal nano-hole group d is around 100-550 nm. The template comprises c-plane sapphire 21 with a layer of MOCVD deposited GaN 22 on top. Both the micrometer-scale 25 and nanometer-scale sized patterns 24 comprise holes etched within a dielectric layer 23 to expose the GaN 22. The etch depth is well controlled so that only the dielectric 23 is removed. The profile of the etched micrometer-scale hole pattern 25 and nanometer-scale hole pattern 24 along a line 26 is illustrated in FIG. 3b.

A full LED structure may be grown on the composite pixelated patterned templates, and deposited with p-contact metals and alloys, reflectors, and heat sink metal composite, then mounted onto a sub-mount. The mounted LED devices can then be separated from the substrate by laser ablation, wet etching or electrochemical etching. The final device is a thin GaN vertical LED.

EXAMPLE 5

In Examples 1 to 4, the full LED structure grown on the composite pixelated patterned templates is deposited with the p-contact metals and alloys, reflectors, and heat sink metal composite, then mounted onto a sub-mount. The mounted LED devices can then be separated from the substrate by laser ablation, wet etching, electrochemical etching. The final device is a thin GaN vertical LED.

It will be apparent to those skilled in the art that a wide range of methods and process parameters can be accommodated within the scope of the invention, not just those explicitly described above. For example, nano-pattern can consist of nano-columns (nano-rods). The micrometer-scale sized patterns can be fabricated by photolithography, imprint (photo and thermal technique), focused ion beam, mechanical cutting, and laser cutting. The nano-columns may be fabricated so as to have various shapes of tips, chosen as appropriate for the application in hand. The micrometer-scale and nanometer-scale patterns columns may be integrated in a controlled manner through the custom designed master so as to have various composite patterns for the application in hand. The patterns can be diffractive lens, fresnel lens, waveguide, photonic crystal, photonic quasicrystal, or gratings etc. The semiconductor material of the initial epitaxy growth may be custom designed so that its properties are tuned to maximize the absorption during a laser ablation separation process. Alternatively, a material can be grown to optimize the selective wet etching processes. InAlN and AlGaN are such examples. Furthermore, the material to form the micrometer-scale and nanometer-scale patterns need not be identical to that of the overgrown compound semiconductor.

EXAMPLE 6

This example is similar to Example 1, except that in this case the composite pixelated patterns are all micrometer-scale sized, i.e. micrometer-scale holes are produced instead of nanometer-scale holes. The pixelated patterned template consists of the circular micrometer-scale holes separated by micrometer-scale sized stripes. The width of the stripe is around 15 µm, and the micrometer-scale hole is a circular shape with a diameter around 1-3 micrometer. The gap between the micrometer-scale holes is around 1-3 micrometer. The substrate is (111) Si deposited with about 20-100 nm AlN. The stripe pattern is formed from a layer of 200 nm thick Si3N4, and the circular shape is removed, by etching, to expose the AlN. The profile of the etched holes is similar to that of the Example 1.

In the specific examples described, the composite pixelated micrometer-scale and/or nanometer-scale patterns are fabricated on the templates (substrates with and without any deposited materials) before overgrowth of the semiconductor material and devices. However, use of a composite pixelated patterned substrate may permit relatively easy removal of the semiconductor material and devices due to the minimum growth onto the micrometer-scale patterned area.

The invention claimed is:

1. A method of producing semiconductor materials and/or devices, comprising:
   providing a template material comprising:
      providing a substrate with a dielectric layer on the substrate; and
      forming a pixelated pattern on the dielectric layer, the pattern comprising a plurality of discrete groups of structures;
      wherein part of the substrate is removed to form a pixelated patterned substrate; and
   growing semiconductor materials and/or devices onto the template.

2. A method according to claim 1, comprising the step of:
   removing the substrate from the grown semiconductor materials and/or devices.

3. A method according to claim 1, wherein the pixelated pattern comprises a plurality of micrometer-scale structures.

4. A method according to claim 3, wherein the structures are in a regular pattern.

5. A method according to claim 3, wherein the structures are in an irregular pattern.

6. A method according to claim 1, wherein the pixelated pattern comprises a plurality of nanometer-scale structures.

7. A method according to claim 1, wherein the discrete groups are separated by micrometer-scale sized stripe boundaries.

8. A method according to claim 1, wherein the structures comprise at least one of the set including columns, rods, holes, pyramids, hemispherical dots and trapezoids.

9. A method of producing a template material for growing semiconductor materials and/or devices, comprising the steps of:
   (a) providing a substrate with a dielectric layer on the substrate; and
   (b) forming a pixelated pattern on the dielectric layer, the pixelated pattern comprising a plurality of discrete groups of structures;
   wherein the pixelated pattern comprises a plurality of combined micrometer-scale and nanometer-scale structures.

10. A method of producing semiconductor materials and/or devices, comprising the steps of providing a template material produced in accordance with claim 9, and
   (c) growing semiconductor materials and/or devices onto the template.

11. A method according to claim 10, further comprising the step of:
   (d) removing the substrate from the grown semiconductor materials and/or devices.

12. A template material comprising a substrate with a dielectric layer on the substrate; the dielectric layer including a plurality of structures formed thereon, wherein the plurality of structures are arranged in discrete groups, so that a pixelated pattern is formed on the dielectric layer;
   wherein the pixelated pattern comprises a plurality of combined micrometer-scale and nanometer-scale structures.

13. A template material according to claim 12, wherein the structures are in a regular pattern.

14. A template material according to claim 12, wherein the structures are in an irregular pattern.

15. A template material according to claim 12, wherein the discrete groups are separated by micrometer-scale sized stripe boundaries.

16. A template material according to claim 12, wherein the structures comprise at least one of the set including columns, rods, holes, pyramids, hemispherical dots and trapezoids.

* * * * *